United States Patent [19]

Naghshineh

[11] Patent Number: 4,912,341
[45] Date of Patent: Mar. 27, 1990

[54] TTL BUFFER CIRCUIT WITH ACTIVE TURN-OFF

[75] Inventor: Kianoosh Naghshineh, Menlo Park, Calif.

[73] Assignee: Advanced Micro Devices, Inc., Sunnyvale, Calif.

[21] Appl. No.: 338,584

[22] Filed: Apr. 17, 1989

[51] Int. Cl.$^4$ .................... H03K 19/088; H03K 19/20
[52] U.S. Cl. .................................. 307/456; 307/263; 307/546; 307/547
[58] Field of Search ............... 307/443, 454, 456, 263, 307/543, 546, 547

[56] References Cited

U.S. PATENT DOCUMENTS 4,593,210 6/1986 Boyer .................................. 307/456

FOREIGN PATENT DOCUMENTS 0225431 6/1987 European Pat. Off. ............ 307/456

Primary Examiner—Andrew J. James
Assistant Examiner—Margaret Rose Wambach
Attorney, Agent, or Firm—Davis Chin

[57] ABSTRACT

A TTL buffer circuit includes an active turn-off means so as to provide faster output transitions without using excess power dissipation. The active turn-off means is formed of a Schottky diode (D402), a resistor (R417), and a Schottky bipolar transistor (Q414) which causes rapid switching of a pull-down transistor (Q413), thereby increasing the speed of the output transitions.

8 Claims, 1 Drawing Sheet

TTL BUFFER CIRCUIT WITH ACTIVE TURN-OFF

BACKGROUND OF THE INVENTION

This invention relates generally to transistor-transistor-logic (TTL) circuitry, and more particularly, it relates to a TTL buffer circuit which includes an active turn-off means so as to provide faster output transitions without using excess power consumption.

Typically, TTL buffer circuits respond to an input signal either by coupling an output terminal to a supply voltage via an active pull-up device when the input signal is in a first logic state or by coupling the output terminal to a ground potential via a pull-down device when the input signal is in a second logic state. A conventional TTL buffer circuit is illustrated in FIG. 1 and has been labeled as "Prior Art."

In FIG. 1, the TTL buffer circuit 10 includes an input terminal 12 and an output terminal 14. A bipolar PNP transistor Q400 has its base connected to the input terminal 12 and is responsive to an input signal OEB which may assume a first or second logic level or state, its emitter coupled to a supply potential or voltage VCC via a resistor R400, and its collector connected to a ground potential. The supply potential VCC is typically +5.0 volts. A Schottky bipolar NPN transistor Q401 has its base connected to the emitter of the transistor Q400, its collector coupled to the supply potential VCC via a resistor R401, and its emitter coupled to the ground potential via a resistor R402. The emitter of the transistor Q401 is also connected to the anode of a Schottky diode D400 and to the base of a phase splitter transistor Q408. The cathode of the Schottky diode D400 is connected to the input terminal 12.

The collector of the phase splitter transistor Q408 is connected to one end of a resistor R415 and to the base of a bipolar pull-up NPN transistor Q411. The other end of the resistor R415 is connected to the supply potential VCC. The emitter of the phase splitter transistor Q408 is connected to one end of a resistor R412 and to the base of a bipolar pull-down NPN transistor Q413. The other end of the resistor R412 is connected to the ground potential. The pull-up transistor Q411 has its collector coupled to the supply potential VCC via a resistor R414 and its emitter connected to the collector and base terminals of a diode-connected transistor Q412. The emitter of the transistor Q412 is connected to the collector of the pull-down transistor Q413, one end of a resistor R416, and the output terminal 14. The other end of the resistor R416 is connected to the supply potential VCC. The pull-down transistor Q413 has its emitter connected to the ground potential.

When the input signal OEB having a low logic level is applied to the input terminal 12, a low logic level will also appear at the base of the phase splitter transistor Q408 and thus no current will be conducted through its collector to emitter thereby turning off the pull-down transistor Q413. As a result, drive current will be supplied to the base of the pull-up transistor Q411 to cause its emitter to source current through the output terminal 14. Therefore, the output signal OE at the output terminal 14 will be at a high logic level. It will be noted that the resistor R412 provides only a passive turn-off since only a discharge current $$\frac{V_{BE}}{R412}$$

is available for turning off the pull-down transistor Q413.

When the input signal OEB having a high logic level is applied to the input terminal 12, a high logic level will be translated to the base of the phase splitter transistor Q408 which renders the transistor Q408 to be conductive and sinks current away from the base of the pull-up transistor Q411. As a result, current from the supply potential VCC will no longer be sourced to the output terminal 14. At the same time, the pull-down transistor Q413 will be rendered conductive through its collector to emitter to ground due to the drive current supplied to its base. Therefore, the output signal OE at the output terminal 14 will be at a low logic level.

It would desirable to increase the speed of the low-to-high and high-to-low output transistions at the output terminal when the appropriate input signal is received at the input terminal without causing excess power dissipation. This is achieved by the present invention through the provision of an active turn-off means.

SUMMARY OF THE INVENTION

Accordingly, it is a general object of the present invention to provide an improved TTL buffer circuit which is relatively simple and economical to manufacture and assemble, but yet overcomes the disadvantage of the prior art buffer circuits.

It is an object of the present invention to provide a TTL buffer circuit having a higher speed of operation which has been traditionally unavailable.

It is another object of the present invention to provide a TTL buffer circuit which includes an active turn-off means so as to provide faster output transitions without using excess power dissipation.

It is still another object of the present invention to provide a TTL buffer circuit which includes active turn-off means formed of a Schottky diode, a Schottky transistor and a resistor.

In accordance with these aims and objectives, the present invention is concerned with the provision of a TTL buffer circuit which includes a pull-up bipolar transistor and a pull-down bipolar transistor. The pull-up transistor has its collector coupled to a supply potential and its emitter coupled to an output terminal. The pull-down transistor has its collector coupled to the emitter of the pull-up transistor and its emitter coupled to a ground potential. An input stage includes a first transistor having its base coupled to an input terminal, its collector coupled to the supply potential, and its emitter coupled to the ground potential. A phase splitter stage includes a second transistor having a base, collector and emitter. The second transistor has its base connected to the emitter of the first transistor and its collector coupled to the supply potential. An active turn-off means includes a third transistor having its base coupled to the collector of the first transistor, its collector coupled to the base of the pull-down transistor, and its emitter coupled to the ground potential.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein.

DESCRIPTION OF THE PREFERRED EMBODIMENT

Figure 2:
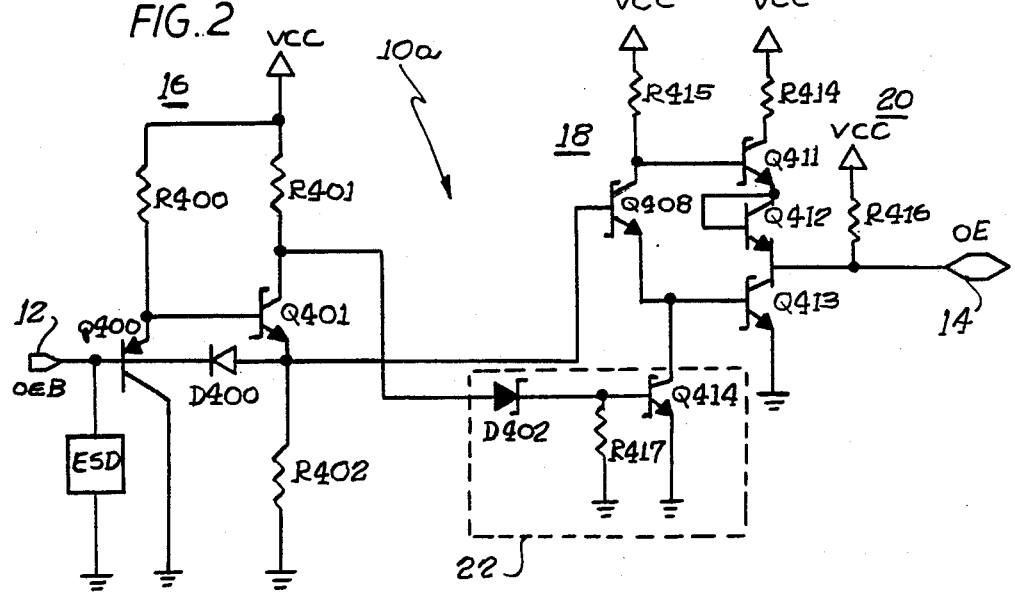
FIG. 2 is a schematic circuit diagram of a TTL buffer circuit constructed in accordance with the principles of the present invention.

In the preferred embodiment of the present invention illustrated in FIG. 2, there is provided an improved TTL buffer circuit 10a which includes an input terminal 12 and an output terminal 14. The buffer circuit 10a consists of an input stage 16, a phase splitter stage 18, an output stage 20, and an active turn-off circuit means 22. The input stage 16 is formed of a PNP bipolar transistor Q400, a Schottky bipolar transistor Q401, a Schottky diode D400, and resistors R400, R401 and R402. The phase splitter means 18 includes a Schottky transistor Q408 and a resistor R415. The output stage 20 is formed of a Schottky bipolar pull-up transistor Q411, a diode-connected bipolar transistor Q412, a Schottky bipolar pull-down transistor Q413, and resistors R414 and R416. The pull-up and pull-down transistors Q411 and Q413 function in the manner heretofore described for sourcing a current from the supply potential VCC to the output terminal 14 or for sinking current from the output terminal to the ground potential.

Figure 1:
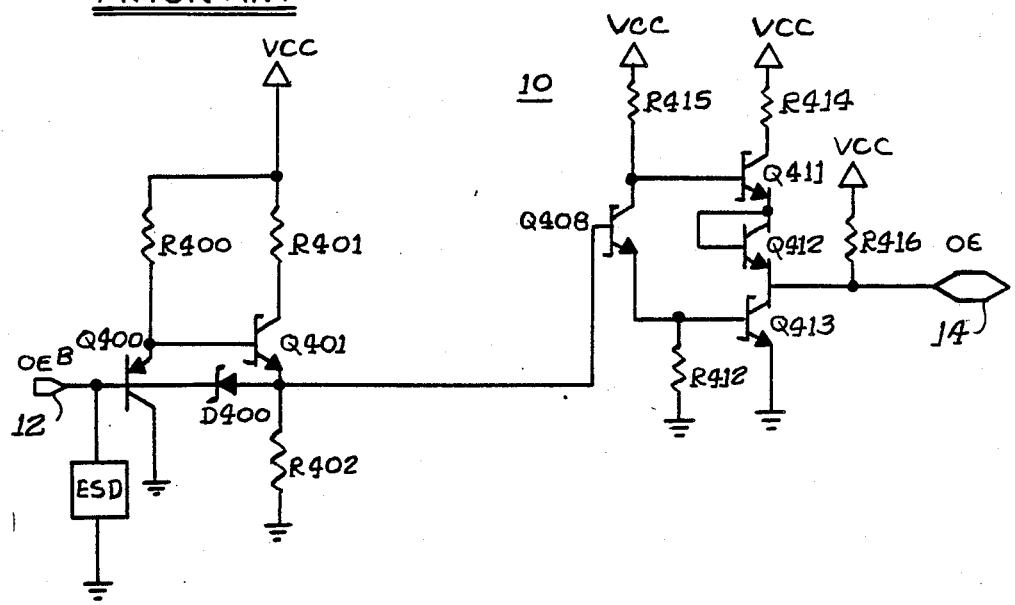
FIG. 1 is a schematic circuit diagram of a prior art TTL buffer circuit.

It should be noted that the circuit components in the input stage 16 and the phase splitter means 18 of the buffer circuit 10a are interconnected and function in the manner previously described with respect to the buffer circuit 10 of FIG. 1 and have been designated with the same reference numerals. Thus, the detailed connection of these circuit components will not be repeated.

In order to enhance or increase the speed of the high-to-low and low-to-high transitions at the output terminal 14 without excess power dissipation, the passive turn-off element or resistor R412 of the buffer circuit 10 shown in FIG. 1 has been replaced by the active turn-off circuit means 22 of the present invention. The circuit means 22 is formed of a Schottky diode D402, a resistor R417 and a Schottky bipolar transistor Q414. The anode of the Schottky diode D402 is connected to the collector of the transistor Q401 in the input stage 16. The cathode of the Schottky diode D402 is connected to one end of the resistor R417 and to the base of the Schottky transistor Q414. The other end of the resistor R417 is connected to the ground potential. The Schottky transistor Q414 has its collector connected to the emitter of the phase splitter transistor Q408 and to the base of the pull-down transistor Q413. The emitter of the Schottky transistor Q414 is connected to the ground potential.

It will be noted that the transistors Q401, Q408, Q411, Q413 and Q414 are preferably Schottky transistors so as to avoid saturation, thereby permitting a higher switching speed of operation. It should be understood to those skilled in the art that the buffer circuit 10a may be formed on a single silicon chip on a monolithic integrated circuit. Further, it will be noted that all of the transistors are of the NPN-type conductivity, except for the transistor Q400.

Now, the operation of the buffer circuit 10a of this invention constructed as described above will be explained. Initially, assume that the input signal OEB having a high or "1" logic level is applied to the input terminal 12. This will cause the transistor Q400 to be rendered non-conductive and will cause the transistor Q401 to be rendered conductive. Therefore, the phase splitter transistor Q408 will receive base drive current from the transistor Q401 and thus be turned on. Simultaneously, the transistor Q414 in the active turn-off circuit 22 will be rendered non-conductive. Further, base drive will be diverted from the pull-up transistor Q411 which causes the same to be rendered non-conductive. Since the phase splitter transistor Q409 is rendered conductive, there will be base drive current supplied to the pull-down transistor Q413 thereby turning on the same. As a consequence, the output signal OE at the output terminal 14 will be pulled down near the ground potential via the transistor Q413.

When the input signal OEB makes a high-to-low transition the transistor Q400 will be rendered conductive which diverts drive current from the base of the transistor Q401. Thus, the transistor Q401 will be rendered non-conductive. As a result, the phase splitter transistor Q408 will become turned off. Simultaneously, the transistor Q414 in the active turn-off circuit 22 will be quickly rendered conductive due to the collector of the transistor Q401 going to a high voltage level. This rapid turn-on of the transistor Q414 serves to draw current away from the base of the pull-down transistor Q413, thereby facilitating the turning off of the transistor Q413 so as to speed up the low-to-high output transition. Since the phase splitter transistor Q408 is rendered non-conductive, drive current from the supply potential VCC will be supplied to the base of the pull-up transistor Q411 thereby turning on the same. As a consequence, the output signal OE at the output terminal 14 will be pulled up to near the supply potential VCC via the resistor R416.

When the input signal OEB makes a low-to-high transition, the transistor Q400 will again be rendered turned on. As a result, the phase splitter transistor Q408 will become turned on. Simultaneously, the transistor Q414 in the active turn-off circuit 22 will be quickly rendered non-conductive. Further, base drive will be diverted from the pull-up transistor Q411 which causes the same to be rendered non-conductive. This rapid turn-off of the transistor Q414 serves to allow the phase splitter transistor Q408 to quickly supply drive current to the base of the pull-down transistor Q413. Thereby facilitating the turning on of the transistor Q413 so as to speed up the high-to-low output transition. As a consequence, the output signal OE at the output terminal 14 will again be pulled down near the ground potential.

In summary, the present invention contemplates for TTL buffer circuits the improvement comprising an active turn-off circuit which includes the transistor Q414 for switching quickly the pull-down transistor Q413 so as to facilitate rapid output transistions while restricting excess power consumption. It can be seen that the increased speed is achieved by limiting and clamping the voltage swing at the collector of the transistor Q401. Furthermore, the switching actions of the active turnoff transistor Q414 and the phase splitter transistor Q408 occur concurrently or in parallel since they both have their switching actions initiated by the transistor Q401 in the input stage 16. This is unlike the prior art where the turn-off is controlled by the phase splitter transistor Q408. In addition, when the the transistor Q414 is turned on the amount of current available for discharging the base of the pull-down transistor Q413 will be greater than what can be provided through the resistor R412, thereby producing an enhanced switching speed.

The buffer circuit 10a of the present invention was built substantially as illustrated using standard silicon IC processing and was found to provide higher switching speeds of operation. The following resistance values were used:

| RESISTOR | VALUE |
| --- | --- |
| R400 | 12 kOhms |
| R401 | 8 kOhms |
| R402, R416 | 10 kOhms |
| R415 | 2 kOhms |
| R414 | 45 Ohms |
| R417 | 5.1 kOhms |

From the foregoing detailed description, it can thus be seen that the present invention provides an improved TTL buffer circuit which has a higher speed of operation but yet without using excess power dissipation. The buffer circuit of the instant invention includes an active turn-off circuit so as to facilitate faster output transitions.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

What is claimed is:

1. A TTL buffer circuit comprising:
    an input stage including a first transistor (Q401) having its base coupled to an input terminal, its collector coupled to a supply potential, and its emitter coupled to a ground potential;
    a phase splitter stage including a second transistor (Q408) having a base, collector and emitter, said second transistor (Q408) having its base connected to the emitter of said first transistor (Q401) and it collector coupled to the supply potential;
    an output stage including a third transistor (Q411) and a fourth transistor (Q413), said third transistor (Q411) having its base connected to the collector of said second transistor (Q408), its collector coupled to the supply potential and its emitter coupled to an output terminal, said fourth transistor (Q413) having its base connected to the emitter of said second transistor (Q408), its collector coupled to the output terminal, and its emitter coupled to the ground potential;
    active turn-off means including a fifth transistor (Q414) having its base coupled to the collector of said first transistor (Q401), its collector coupled to the base of said third transistor (Q413), and its emitter coupled to the ground potential; and
    said active turn-off means further including a Schottky diode (D402) and a resistor (R417), the anode of said Schottky diode (D402) being connected to the collector of said first transistor (Q401), the cathode of said Schottky diode (D402) being connected to one end of said resistor (R417) and the base of said fifth transistor (Q414), the other end of said resistor (R417) being connected to the ground potential.

2. A buffer circuit as claimed in claim 1, wherein said fifth transistor (Q414) is quickly turned on when a low logic level is applied to the input terminal so as to facilitate a rapid low-to-high output transition at the output terminal.

3. A buffer circuit as claimed in claim 2, wherein said fifth transistor (Q414) is quickly turned off when a high logic level is applied to the input terminal so as to facilitate a rapid high-to-low output transition at the output terminal.

4. A further circuit as claimed in claim 1, wherein said first through fourth transistors comprise Schottky transistors.

5. A buffer circuit as claimed in claim 1, wherein said first through fourth transistors are of an NPN-type conductivity.

6. A buffer circuit as claimed in claim 1, wherein said fifth transistor comprises a Schottky transistor.

7. A buffer circuit as claimed in claim 1, wherein said fifth transistor is of an NPN-type conductivity.

8. A buffer circuit as claimed in claim 1, wherein said buffer circuit is formed on a single silicon chip of a monolithic integrated circuit.

* * * * *